(12) United States Patent
Martinez, Jr.

(10) Patent No.: US 7,116,740 B1
(45) Date of Patent: Oct. 3, 2006

(54) METHOD AND SYSTEM FOR PROVIDING CLOCK SIGNALS

(75) Inventor: Marvin W. Martinez, Jr., Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 751 days.

(21) Appl. No.: 10/354,239

(22) Filed: Jan. 29, 2003

(51) Int. Cl.
*H04L 7/00* (2006.01)
*H04J 3/06* (2006.01)

(52) U.S. Cl. ........................ 375/354; 370/503
(58) Field of Classification Search ........... 375/354, 375/355, 357, 360; 370/503, 507, 508, 509, 370/510, 511, 512, 513, 514; 331/46, 47, 331/51, 52, 55, 56, 67, 182; 327/144, 145, 327/162, 163; 713/500, 501, 502, 503, 600; 709/248
See application file for complete search history.

(56) References Cited

U.S. PATENT DOCUMENTS

| | | | |
|---|---|---|---|
| 5,087,829 A * | 2/1992 | Ishibashi et al. ............ 327/152 |
| 5,734,301 A | 3/1998 | Lee et al. ...................... 331/2 |
| 6,067,335 A | 5/2000 | Yamanoi et al. ............ 375/374 |
| 6,104,667 A * | 8/2000 | Akaogi ........................ 365/233 |
| 6,112,308 A | 8/2000 | Self et al. .................... 713/400 |
| 6,127,864 A * | 10/2000 | Mavis et al. ................ 327/144 |
| 6,182,236 B1 | 1/2001 | Culley et al. ............... 713/503 |
| 6,370,200 B1 * | 4/2002 | Takahashi .................... 375/257 |

* cited by examiner

*Primary Examiner*—Khanh Tran
*Assistant Examiner*—Sam K. Ahn
(74) *Attorney, Agent, or Firm*—Baker Botts L.L.P.

(57) ABSTRACT

Providing clock signals includes receiving a first clock signal at a first clock circuit and at a second clock circuit, where the first clock signal comprises first cycles. A second clock signal is generated from the first clock signal at the first clock circuit, where the second clock signal comprises second cycles and a first cycle corresponds to a first multiple of the second cycles. A third clock signal is generated from the first clock signal at the second clock circuit, where the third clock signal comprises third cycles and a second cycle corresponds to a second multiple of the third cycles. The first clock signal and the second clock signal are sampled using the third clock signal. A safe cycle is determined in response to the sampled clock signals. Data is transferred in accordance with the safe cycle.

22 Claims, 4 Drawing Sheets

METHOD AND SYSTEM FOR PROVIDING CLOCK SIGNALS

TECHNICAL FIELD OF THE INVENTION

This invention relates generally to the field of digital electronic circuits and more specifically to a method and system for providing clock signals.

BACKGROUND OF THE INVENTION

Electronic devices often require clock signals of different frequencies. Typically, a single clock system such as a phase locked loop circuit is used to generate multiple clock signals having different frequencies. Clock signals at certain frequencies, however, are difficult to generate, and circuits running at clock signals having different frequencies are difficult to synchronize. Consequently, previous techniques for providing clock signals are unsatisfactory for some situations.

SUMMARY OF THE INVENTION

In accordance with the present invention, disadvantages and problems associated with previous techniques for providing clock signals may be reduced or eliminated.

According to one embodiment of the present invention, providing clock signals includes receiving a first clock signal at a first clock circuit and at a second clock circuit, where the first clock signal comprises first cycles. A second clock signal is generated from the first clock signal at the first clock circuit, where the second clock signal comprises second cycles and a first cycle corresponds to a first multiple of the second cycles. A third clock signal is generated from the first clock signal at the second clock circuit, where the third clock signal comprises third cycles and a second cycle corresponds to a second multiple of the third cycles. The first clock signal and the second clock signal are sampled using the third clock signal. A safe cycle is determined in response to the sampled first clock signal and the sampled second clock signal. Data is transferred between a circuit running at the second clock signal and a circuit running at the third clock signal in accordance with the safe cycle.

Certain embodiments of the invention may provide one or more technical advantages. A technical advantage of one embodiment may be that a plurality of clock circuits may be used to generate clock signals of different frequencies. The clock circuits may generate clock signals of any of a number of frequencies. Another technical advantage of one embodiment may be that safe cycles during which data may be transferred between circuits at different frequencies are determined with respect to an alpha cycle. The alpha cycle is detected by sampling lower frequency clock signals triggered by a higher frequency clock signal.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 8 of the drawings, like numerals being used for like and corresponding parts of the various drawings.

Figure 1:
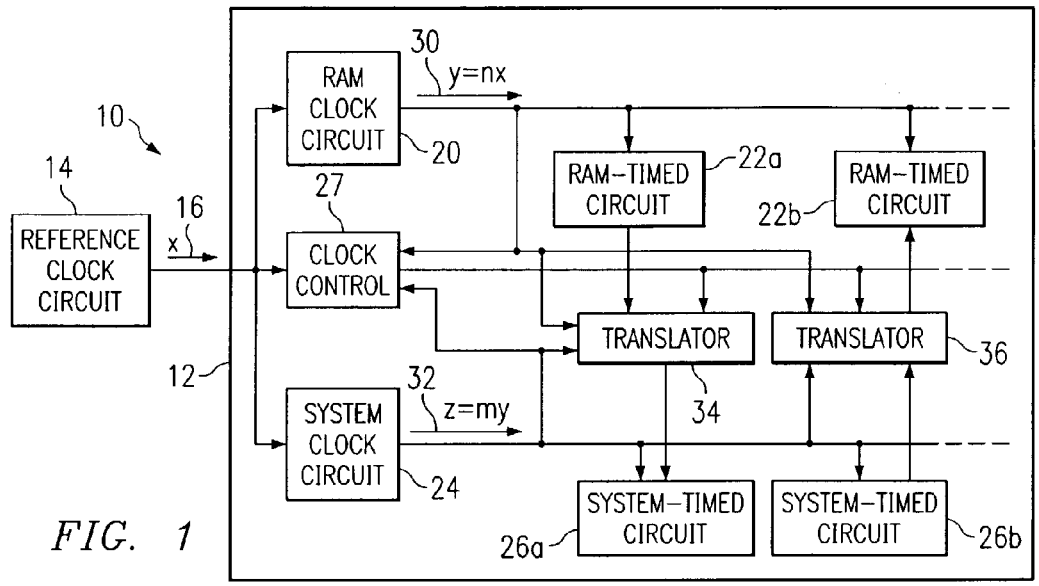
FIG. 1 is a block diagram illustrating one embodiment of a system for providing clock signals.

FIG. 1 is a block diagram illustrating one embodiment of a system 10 for providing clock signals. System 10 includes a device 12 that has a plurality of clock circuits that may be used to generate clock signals at any of a number of frequencies. Device 12 also provides for pseudo-synchronous transmission of data between circuits using the clock signals of different frequencies.

Specifically, system 10 includes a reference clock circuit 14 and device 12. Reference clock circuit 14 generates a reference clock signal 16 with a frequency x. Device 10 includes a random-access memory (RAM) clock circuit 20 associated with internal and external RAM-timed circuits 22 and a system clock circuit 24 associated with internal system-timed circuits 26. RAM clock circuit 20 generates a RAM clock signal 30 that is substantially synchronized with reference clock signal 16. RAM clock signal 30 may have a frequency y=nx that is a multiple n of the frequency x of reference clock signal 16. Multiple n may have a value of, for example, two. Multiple n, however, may have any suitable integer value such as integer n, 1<n<16. RAM clock circuit 20 supplies RAM clock signal 30 to RAM-timed circuits 22 for use by RAM-timed circuits 22 for timing. RAM clock circuit 20 may comprise a phase-locked loop circuit or other suitable oscillating circuit, and a RAM-timed circuit 22 may comprise a storage or processing circuit.

System clock circuit 24 generates a system clock signal 32 that is substantially synchronized with reference clock signal 16. System clock signal 32 may have a system clock frequency x=my that is a multiple m of the reference clock frequency y of reference clock signal 16. Multiple m may have a value of, for example, 1, 2, 3, 4, or 5. Multiple m, however, may have any suitable value. Additionally, system clock circuit 24 may change the value of multiple m during operation. System clock circuit 24 supplies system clock signal 32 to system-timed circuits 26 for use by system-timed circuits 26 for timing. System clock circuit 24 may comprise a phase-locked loop circuit or other suitable oscillating circuit, and a system-timed circuit 26 may comprise a storage or processing circuit.

A clock control 27 samples RAM clock signal 30 and system clock signal 32 and determines safe cycles during which data may be transferred between RAM-timed circuits 22 and system-timed circuits 26. Data transfer may occur between one circuit that uses one clock signal for timing and another circuit that uses a second, disparate clock signal for timing. Clock control 27 is described in more detail in connection with FIG. 2.

Translators 34 and 36 are used to transfer data between RAM-timed circuits 22 and system-timed circuits 26. Translator 34 sends data from RAM-timed circuit 22a to system-timed circuit 26a, and translator 36 sends data from system-timed circuit 26b to RAM-timed circuit 22b. Translators 34 and 36 receive notification of safe cycles from clock control 27 and transfer the data during the safe cycles.

Some of the modules of system may be omitted or others added without departing from the scope of the invention. For example, device 12 may include more clock circuits 20 and 24, more or fewer circuits 22 and 26, or more or fewer translators 34 and 36.

Figure 2:
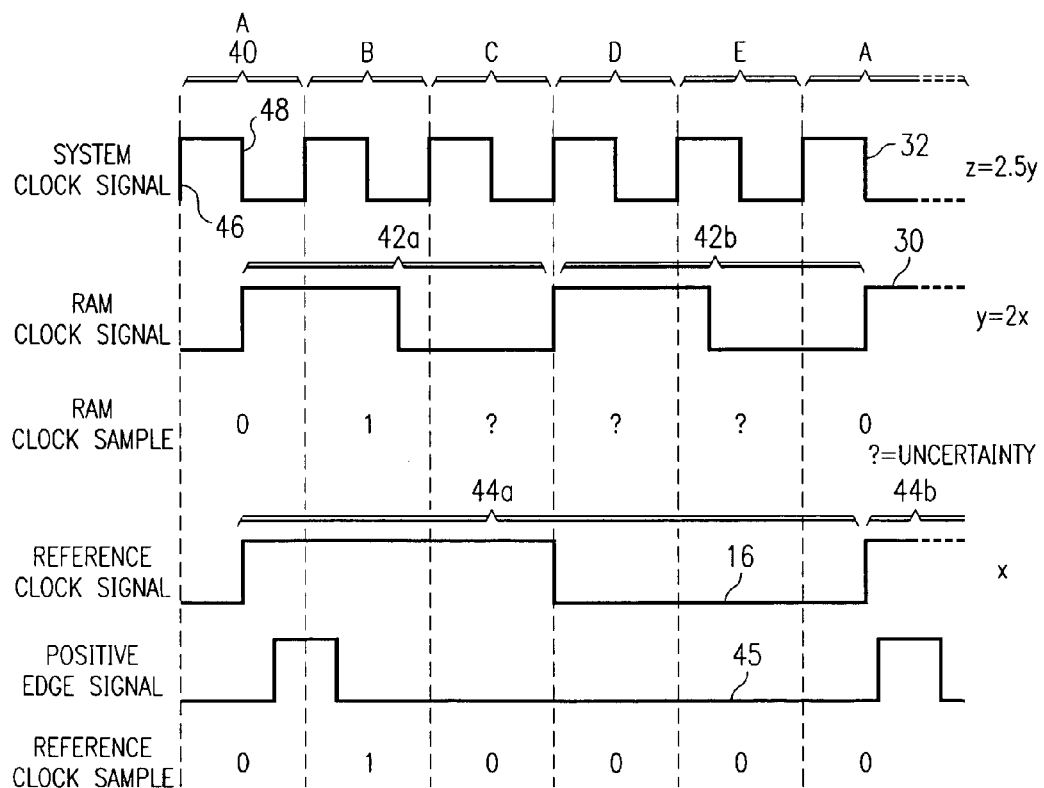
FIG. 2 is a diagram illustrating a system clock signal, a RAM clock signal, and a reference clock signal that have been digitized.

FIG. 2 is a diagram illustrating system clock signal 32, RAM clock signal 30, and reference clock signal 16 that have been digitized. In the illustrated example, RAM clock signal 30 has a frequency y that is two times frequency x of reference clock signal 16, and system clock signal has a frequency z that is 2.5 times frequency y of RAM clock signal 30.

Each signal has cycles, where each cycle corresponds to one positive alternation and one negative alternation of a signal. "Each" as used in this document refers to each member of a set or each member of a subset of the set. System clock signal 32 has system clock cycles 40, labeled A, B, C, D, and E. RAM clock signal 30 has RAM clock cycles 42, and reference clock signal 16 has cycles 44. A cycle has a positive edge 46 of a positive alternation and a negative edge 48 of a negative alternation.

The cycles of a higher frequency signal and a lower frequency signal may follow a pattern of repeating segments, where each segment corresponds to an integer number of higher frequency cycles and an integer number of lower frequency signals. For example, system clock cycles 40 and RAM clock cycles 42 follow a pattern with segments that each include five system clock cycles A, B, C, D, and E and two RAM clock cycles 42.

In order to reduce data transmission error, clock control 27 determines safe cycles during which data may be transmitted. A safe cycle may be identified with respect to the relationship between the cycles of a signal of a transmitting clock circuit and the cycles of a signal of a receiving clock circuit. Data transmission may be unreliable if, due to jitter or other factors, a cycle of the transmitting signal of a transmitting clock circuit cannot be reliably matched with a cycle of the receiving signal of a receiving clock circuit such that a positive alternation of the transmitting signal corresponds to a positive alternation of the receiving signal.

In the illustrated example, data transmission from a system-timed circuit 26 supplied with system clock signal 32 to a RAM-timed circuit 22 supplied with RAM clock signal 30 may be less reliable at cycles A, C, and D, and data transmission may be more reliable during cycles B and E. For example, jitter may cause cycle A to coincide with the positive alternation of RAM clock cycle 42a or with the negative alternation of the previous RAM clock cycle. Cycle B, however, may be reliably matched with RAM clock cycle 42a. Safe cycles may be identified as cycles of the highest frequency signal, for example, system clock signal 32. In the illustrated example, cycles B and E may be identified as safe cycles.

To determine occurrences of the safe cycles, a higher frequency cycle of each segment is designated as an alpha cycle. The alpha cycle comprises any portion of the pattern that may be used to determine at which portion of the pattern a signal is located. Clock control 27 detects the occurrence of the alpha cycles and determines the occurrence of the safe cycles from the detected alpha cycles. In the illustrated example, a system clock cycle 40, for example, cycle A, is designated as the alpha cycle, which is used to determine the occurrences of safe cycles B and E.

In order to detect occurrences of the alpha cycles, the lower frequency signals may be sampled using the higher frequency signal. The sampling yields a unique combination of samples for the alpha cycle. In the illustrated example, RAM clock signal 30 and reference clock signal 16 are sampled using system clock signal 32. Sampling may occur at, for example, positive edges 46 of system clock signal 32. For example, sampling RAM clock signal 30 at positive edge 46 of cycle B yields a one.

Due to the jitter or other factors, sampling may result in uncertainties. For example, if RAM clock signal 30 is sampled at or near a positive edge 46 or negative edge 48, an uncertainty may result. Sampling at cycles C, D, and E occur at or near edges of RAM clock signal 30, yielding uncertainties. Due to uncertainties, sampling only one signal may not provide a unique sampling that may be used to identify the alpha cycle. Accordingly, another signal such as reference clock signal 16 may be sampled. According to one embodiment, reference clock signal 16 is delayed and is sampled such that a value of one is returned once for each positive alternation. A positive edge detect may be used to detect the positive edges 46 of the delayed RAM clock signal 30 and to generate a positive edge signal 45. The reference clock sample is generated by sampling the positive edge signal 45. Sampling the positive edge signal 45 may be tolerant to duty cycle inaccuracies.

The RAM clock sample and the reference clock sample provide a unique combination of signatures for each system clock cycle A, B, C, D, and E. Clock control 27 detects the combination of signatures for the alpha cycle and uses the alpha signal to determine the occurrences of the safe cycles.

Figure 3:
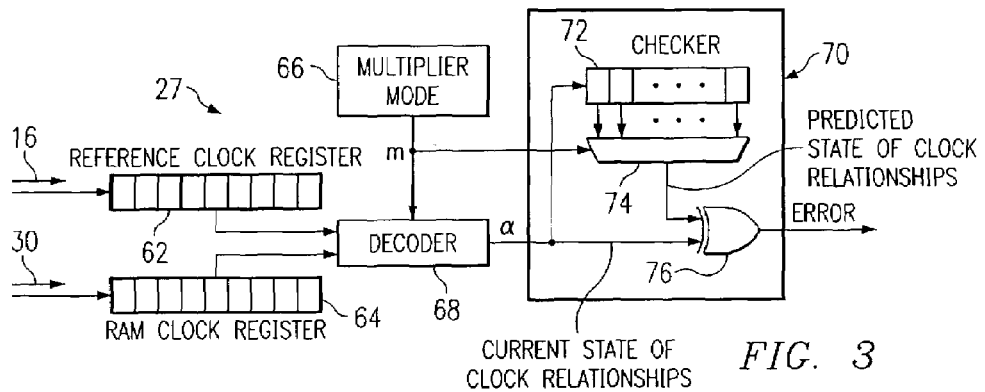
FIG. 3 is a block diagram illustrating a clock control for identifying system clock signals.

FIG. 3 is a block diagram illustrating one embodiment of clock control 27 for identifying alpha cycles. Clock control 27 includes a reference clock register 62 and a RAM clock register 64. Reference clock register 62 and RAM clock register 64 sample and serially digitize reference clock signal 16 and RAM clock signal 30, respectively. Reference clock register 62 records values of reference clock signal 16 sampled using system clock signal 32. According to one embodiment, reference clock signal 16 is sampled by sampling positive edge signal 45 generated by detecting positive edges 46 of reference clock signal 16. RAM clock register 64 records values of RAM clock signal 30 sampled using system clock signal 32.

A multiplier mode 66 supplies multiplier m that describes the relationship between frequency z of system clock signal 32 and frequency y of RAM clock signal 30 according to the equation z=my. A decoder 68 detects the alpha cycle from the sampled reference clock signal 16, the sampled RAM clock signal 30, and multiplier m. A checker 70 determines whether RAM clock circuit 20 and system clock circuit 24 are synchronized.

Checker 70 predicts a next occurrence of the alpha cycle and determines whether the alpha cycle actually occurred when predicted. If the alpha cycle did not occur when predicted or if the alpha cycle occurred when not predicted, checker 70 determines that RAM clock circuit 20 and system clock circuit 24 are not synchronized. The predicted alpha cycle may be predicted in an arbitrary number of clocks in advance. The predicted alpha cycle may be broadcast across the system and locally delayed into the correct clock.

According to one embodiment, checker 70 includes a shift register 72, a multiplexer 74, and an XOR gate 76. Shift register 72 stores values corresponding to an alpha cycle. Multiplexer 74 delays the values in accordance with multiplier m such that the values arrive at XOR gate 76 when the next occurrence of the alpha cycle is predicted. XOR gate 76 checks to see if the values corresponding to the actual next occurrence match the values corresponding to the predicted next occurrence to determine if RAM clock circuit 20 and system clock circuit 24 are synchronized.

Registers 62 and 64 may be suitably sized to store m samples of signals 16 and 30 in order to provide sufficient samples to detect the alpha cycle. In order to provide sufficient data to allow for error detection by checker 70, registers 62 and 64 may be suitably sized to store a segment of signals 16 and 30.

Figure 4:
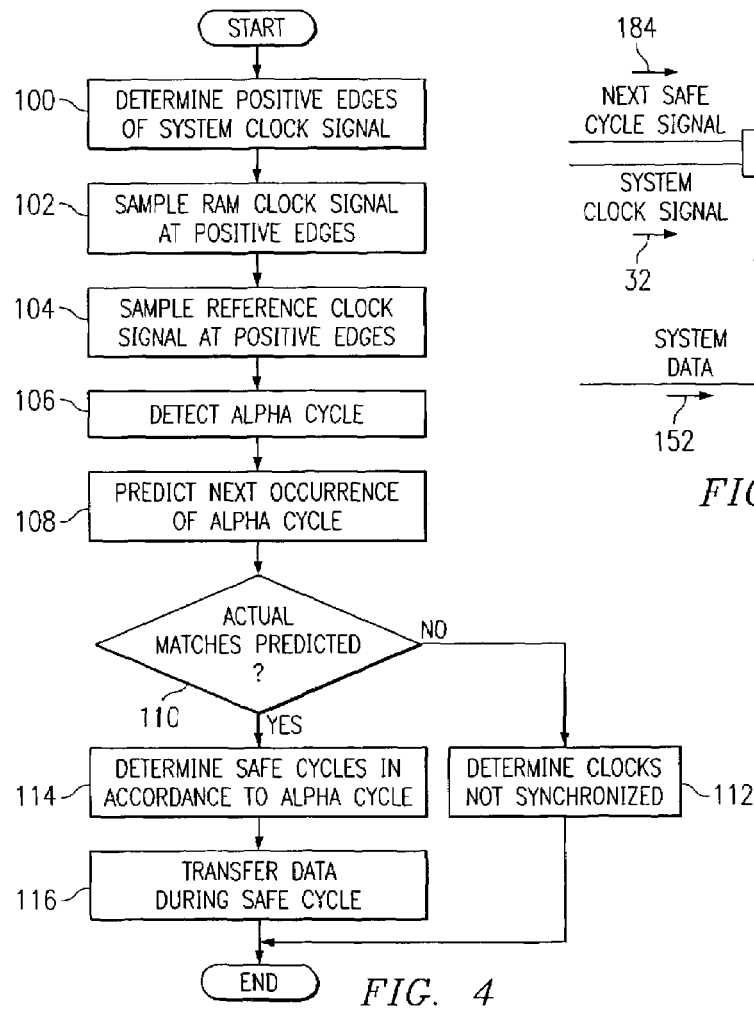
FIG. 4 is a flowchart illustrating one embodiment of a method for determining safe cycles.

FIG. 4 is a flowchart illustrating one embodiment of a method for determining safe cycles. The method begins at step 100, where positive edges 46 of system clock signal 32 are determined. RAM clock signal 30 is sampled at positive edges 46 of system clock signal 32 at step 102. Reference clock signal 16 is sampled at positive edges 46 of system clock signal 32 at step 104. Reference clock signal 16 may be sampled by, for example, sampling a positive edge signal 45 of a delayed reference clock signal 16.

An alpha cycle is detected at step 106. Decoder 68 detects the alpha cycle from sampled RAM clock signal 30, sampled reference clock signal 16, and multiplier m received from multiplier mode 66. To determine whether RAM clock circuit 20 and system clock circuit 24 are synchronized, checker 70 predicts a next occurrence of the alpha cycle at step 108. If the actual occurrence of the alpha cycle matches the predicted occurrence at step 110, the method proceeds to step 112, where checker 70 determines that RAM clock circuit 20 and system clock circuit 24 are not synchronized. After determining the clock circuits are not synchronized, the method terminates.

If the actual occurrence of the alpha cycle matches the predicted occurrence at step 110, the method proceeds to step 114. Decoder 68 determines the safe cycles during which data may be reliably transferred. The safe cycles may be determined with respect to the identified alpha cycle. Data is transferred during the safe cycles at step 116. After transferring the data, the method terminates. One skilled in the art will understand that the steps of the method may be performed simultaneously or in a different order. For example, the sampling steps 102 and 104 may occur simultaneously.

Figure 5:
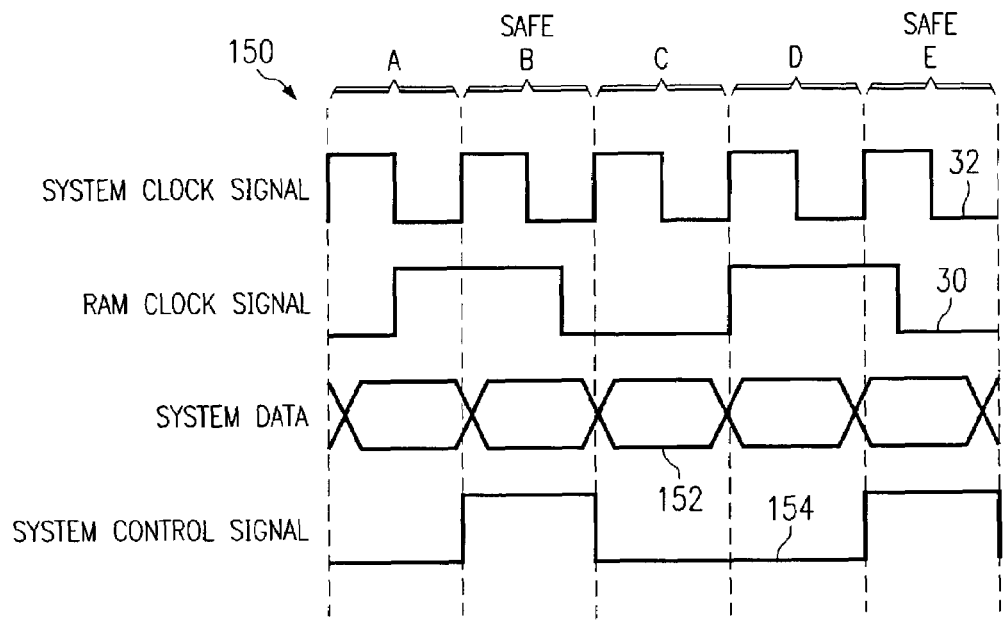
FIG. 5 is a diagram illustrating transfer of data from a system-timed circuit to a RAM-timed circuit.

FIG. 5 is a diagram 150 illustrating transfer of data from system-timed circuit 26b to RAM-timed circuit 22b. Diagram 150 includes system clock signal 32, RAM clock signal 30, and system data 152. System data 152 is available to be transferred at system clock cycles 40. Data transfer may be unreliable at system clock cycles 40 cannot be reliably matched with RAM clock cycles 42. In the illustrated example, system clock cycles A, C, and D cannot be reliably matched with RAM clock cycles 42. Accordingly, data may be less reliably transferred during cycles A, C, and D, and data may be more reliably transferred during cycles B and E.

A system control signal 154 directs the transfer of data from system-timed circuit 26b to RAM-timed circuit 22b such that data is transferred during cycles B and E. The data is delayed such that one unit of data arrives at RAM clock circuit 20 at each RAM cycle 42.

Figure 6:
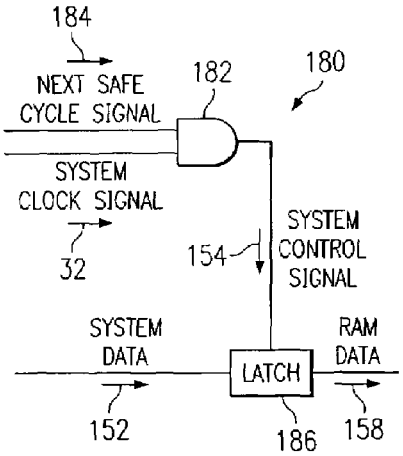
FIG. 6 is a block diagram illustrating one embodiment of a system for transferring data from a system-timed circuit to a RAM-timed circuit.

FIG. 6 is a block diagram illustrating one embodiment of a system 180 for transferring data from system-timed circuit 26b to RAM-timed circuit 22b. System 180 receives a next safe cycle signal 184 and system clock signal 32. Next safe cycle signal 184 is generated using the alpha cycle and indicates when the next safe cycle, for example, cycle B or E, is to occur. An AND gate 182 combines next safe cycle signal 184 and system clock signal 32 to generate system control signal 154, which is sent to a latch 186. Latch 186 delays system data 152 according to system control signal 154 to generate RAM data 158 that is transferred during the safe cycles.

Figure 7:
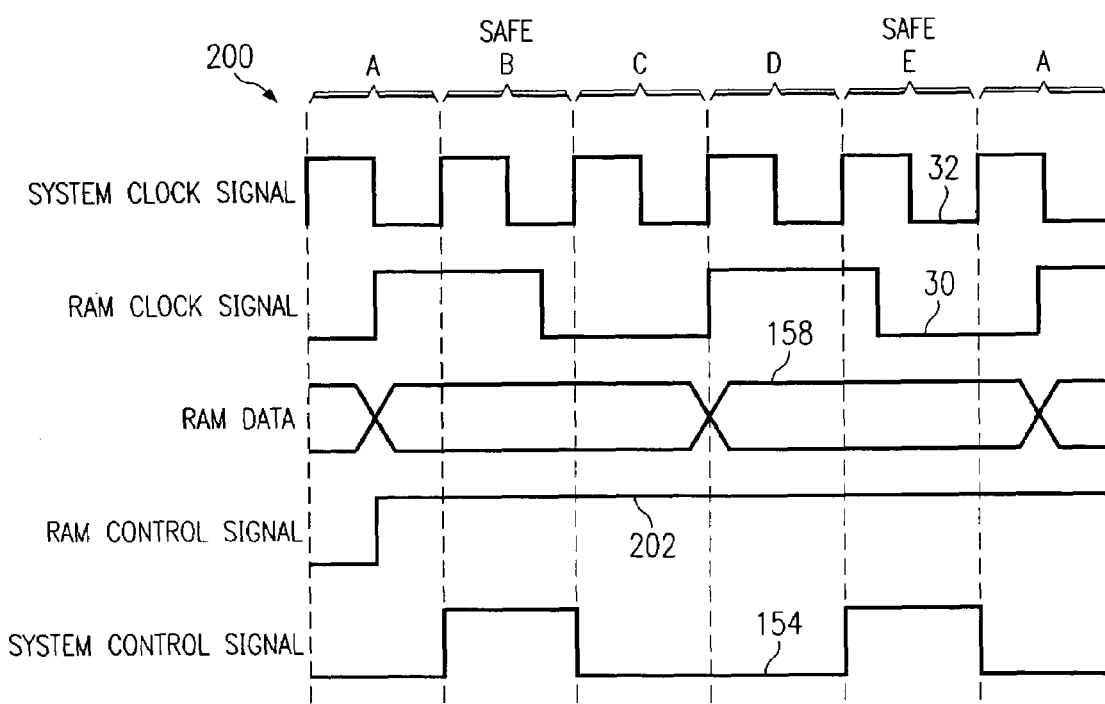
FIG. 7 is a diagram illustrating transfer of data from a RAM-timed circuit 22a to a system-timed circuit.

FIG. 7 is a diagram 200 illustrating transfer of data from RAM-timed circuit 22a to system-timed circuit 26a. Diagram 200 includes system clock signal 32, RAM clock signal 30, and RAM data 158. Data transfer from RAM-timed circuit 22a to system-timed circuit 26a may be unreliable if a unit of RAM data 158 coincides with multiple system clock cycles 40. Accordingly, system control signal 154 and RAM control signal 202 may be adjusted such that one cycle of system control signal 154 corresponds to one cycle of RAM control signal 202 such that during a given duration, there are approximately the same number of cycles of system control signal 154 as there are of cycles of RAM control signal 202.

Figure 8:
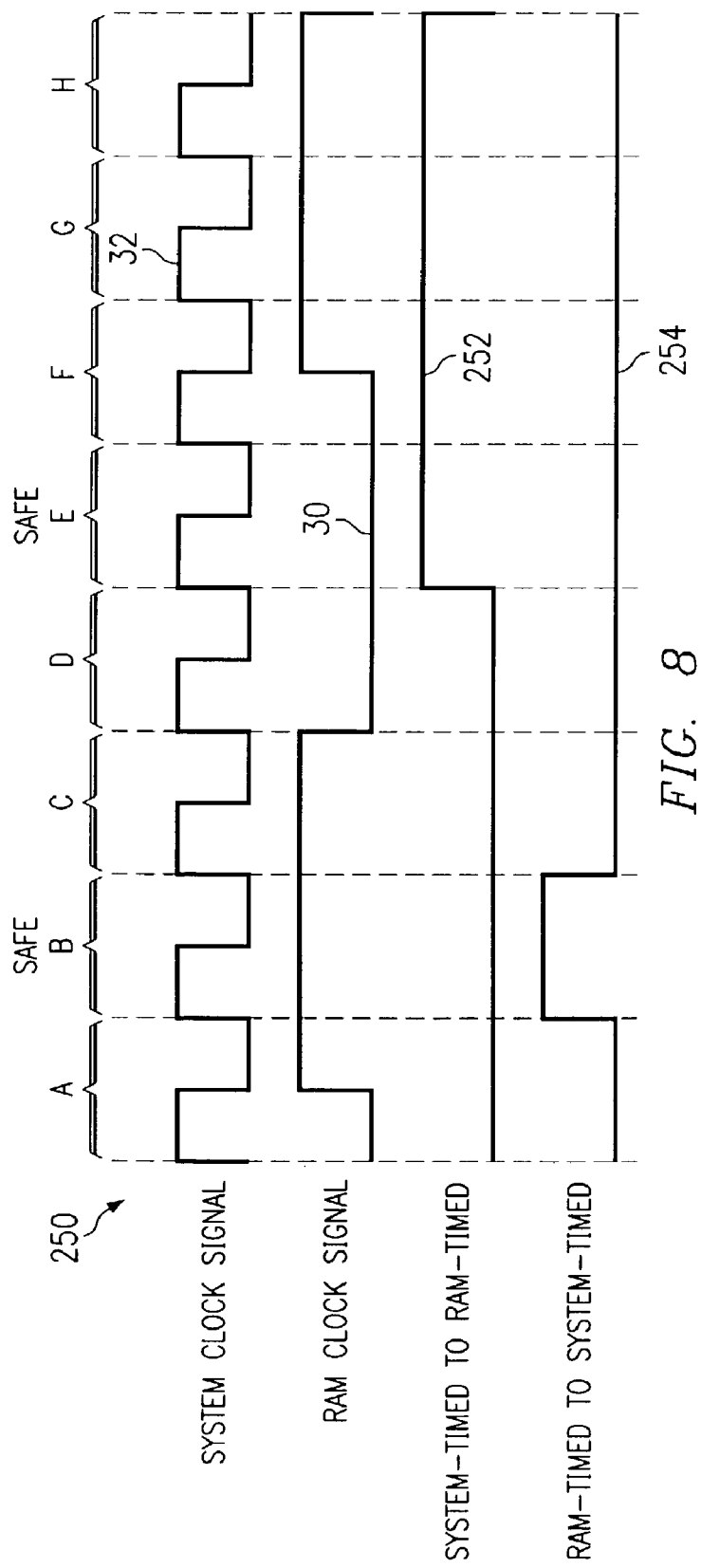
FIG. 8 is a diagram illustrating procedures that may be used to enhance performance of data transfer.

FIG. 8, is a diagram 250 illustrating procedures that may be used to enhance data transfer performance. Diagram 250 includes system clock signal 32 and RAM clock signal 30. In the illustrated example, a segment includes ten system clock cycles 40 and two RAM clock cycles 42. There are multiple safe cycles, for example, cycles B and E, for each RAM clock cycle 42.

A particular safe cycle of the multiple safe cycles may be selected in order to enhance performance. Typically, data sent from system-timed circuit 26b to RAM-timed circuit 22b comprises requests for information. A later safe cycle, for example, cycle E, of each RAM clock cycle 42 may be selected to allow system clock circuit 24 to perform procedures such as prioritization procedures. Typically, data sent from RAM-timed circuit 22a to system-timed circuit 26a comprises information sent in response to a request. An earlier safe cycle, for example, cycle B, may be selected to provide for faster transfer of information.

Certain embodiments of the invention may provide one or more technical advantages. A technical advantage of one embodiment may be that a plurality of clock circuits 20 and 24 may be used to generate clock signals 30 and 32 of different frequencies. The clock circuits 20 and 24 may generate signals 30 and 32 of any of a number of frequencies. Another technical advantage of one embodiment may be that safe cycles during which data may be transferred between circuits at different frequencies are determined with respect to an alpha cycle. The alpha cycle is detected by sampling lower frequency clock signals using a higher frequency clock signal.

Although an embodiment of the invention and its advantages are described in detail, a person skilled in the art could make various alterations, additions, and omissions without departing from the spirit and scope of the present invention as defined by the appended claims.

What is claimed is:

1. A method for providing a plurality of clock signals, comprising:

receiving a first clock signal at a first clock circuit and at a second clock circuit, the first clock signal comprising a plurality of first cycles;

generating a second clock signal from the first clock signal at the first clock circuit, the second clock signal comprising a plurality of second cycles, a second cycle of the plurality of second cycles corresponding to a first multiple of the first cycles;

generating a third clock signal from the first clock signal at the second clock circuit, the third clock signal comprising a plurality of third cycles, a third cycle of the plurality of third cycles corresponding to a second multiple of the second cycles;

sampling the first clock signal and the second clock signal using the third clock signal;

determining a safe cycle in response to the sampled first clock signal and the sampled second clock signal; and transferring data between a first circuit running at the second clock signal and a second circuit running at the third clock signal in accordance with the safe cycle in order to provide the plurality of clock signals.

2. The method of claim 1, wherein the sampling the first clock signal and the second clock signal using the third clock signal comprises:

detecting an edge of a third cycle of the plurality of third cycles of the third clock signal;

sampling the second clock signal approximately when the edge is detected; and sampling the first clock signal approximately when the edge is detected.

3. The method of claim 1, wherein the determining the safe cycle in response to the sampled first clock signal and the sampled second clock signal comprises:

detecting an alpha cycle of the third clock signal in response to the sampled first clock signal and the sampled second clock signal; and determining the safe cycle with respect to the alpha cycle.

4. The method of claim 1, wherein the determining the safe cycle in response to the sampled first clock signal and the sampled second clock signal comprises:

establishing a value for the second multiple;

detecting an alpha cycle according to the sampled first clock signal, the sampled second clock signal, and the value of the second multiple; and determining the safe cycle with respect to the alpha cycle.

5. The method of claim 1, wherein the transferring the data between the first circuit running at the second clock signal and the second circuit running at the third clock signal in accordance with the safe cycle comprises:

determining an occurrence of the safe cycle, the safe cycle representing a cycle during which the data is to be transferred from the second circuit running at the third clock signal to the first circuit running at the second clock signal;

delaying the data from the second circuit running at the third clock signal; and transferring the data during the occurrence of the safe cycle.

6. The method of claim 1, wherein the transferring the data between the first circuit running at the second clock signal and the second circuit running at the third clock signal in accordance with the safe cycle comprises:

determining an occurrence of the safe cycle, the safe cycle representing a cycle during which the data is to be transferred from the first circuit running at the second clock signal to the second circuit running at the third clock signal;

generating a control signal, a cycle of the control signal corresponding to the safe cycle; and transferring the data from the first circuit running at the second clock signal to the second circuit running at the third clock signal according to the control signal.

7. The method of claim 1, wherein the transferring the data between the first circuit running at the second clock signal and the second circuit running at the third clock signal in accordance with the safe cycle comprises:

determining a plurality of safe cycles of the third clock signal corresponding to a second cycle of the plurality of second cycles of the second clock signal, each safe cycle of the plurality of safe cycles representing a cycle during which the data is to be transferred, the data comprising a request; and transferring the data during a last safe cycle of the safe cycles.

8. The method of claim 1, wherein the transferring the data between the first circuit running at the second clock signal and the second circuit running at the third clock signal in accordance with the safe cycle comprises:

determining a plurality of safe cycles of the third clock signal corresponding to a second cycle of the plurality of second cycles of the second clock signal, each safe cycle of the plurality of safe cycles representing a cycle during which the data is to be transferred, the data comprising a response; and transferring the data during a first safe cycle of the safe cycles.

9. The method of claim 1, further comprising:
predicting a predicted occurrence of an alpha cycle;
detecting an actual occurrence of the alpha cycle;
determining that the actual occurrence and the predicted occurrence are asynchronous; and
determining that the first clock circuit and the second clock circuit are asynchronous.

10. The method of claim 1, further comprising:
predicting a predicted occurrence of an alpha cycle;
broadcasting the predicted occurrence; and
delaying the predicted occurrence to synchronize the first clock circuit and the second clock circuit.

11. A device for providing a plurality of clock signals, comprising:

a first clock circuit operable to:
receive a first clock signal comprising a plurality of first cycles; and
generate a second clock signal from the first clock signal, the second clock signal comprising a plurality of second cycles, a second cycle of the plurality of second cycles corresponding to a first multiple of the first cycles;

a second clock circuit operable to:
receive the first clock signal; and
generate a third clock signal from the first clock signal, the third clock signal comprising a plurality of third cycles, a third cycle of the plurality of third cycles corresponding to a second multiple of the second cycles;

a clock control coupled to the first clock circuit and the second clock circuit and operable to:
sample the first clock signal and the second clock signal using the third clock signal; and
determine a safe cycle in response to the sampled first clock signal and the sampled second clock signal; and a translator coupled to the clock control and operable to transfer data between a first circuit running at the second clock signal and a second circuit running at the third clock signal in accordance with the safe cycle in order to provide the plurality of clock signals.

12. The device of claim 11, wherein the clock control is operable to sample the first clock signal and the second clock signal using the third clock signal by:
   detecting an edge of a third cycle of the plurality of third cycles of the third clock signal;
   sampling the second clock signal approximately when the edge is detected; and
   sampling the first clock signal approximately when the edge is detected.

13. The device of claim 11, wherein the clock control is operable to determine the safe cycle in response to the sampled first clock signal and the sampled second clock signal by:
   detecting an alpha cycle of the third clock signal in response to the sampled first clock signal and the sampled second clock signal; and
   determining the safe cycle in accordance with the alpha cycle.

14. The device of claim 11, wherein the clock control is operable to determine the safe cycle in response to the sampled first clock signal and the sampled second clock signal by:
   establishing a value for the second multiple; and
   detecting an alpha cycle according to the sampled first clock signal, the sampled second clock signal, and the value of the second multiple; and
   determining the safe cycle in accordance with the alpha cycle.

15. The device of claim 11, wherein the translator is operable to transfer the data between the first circuit running at the second clock signal and the second circuit at the third clock signal in accordance with the safe cycle by:
   determining an occurrence of the safe cycle, the safe cycle representing a cycle during which the data is to be transferred from the second circuit running at the third clock signal to the first circuit running at the second clock signal;
   delaying the data from the second circuit running at the third clock signal; and
   transferring the data during the occurrence of the safe cycle.

16. The device of claim 11, wherein the translator is operable to transfer the data between the first circuit running at the second clock signal and the second circuit at the third clock signal in accordance with the safe cycle by:
   determining an occurrence of the safe cycle, the safe cycle representing a cycle during which the data is to be transferred from the first circuit running at the second clock signal to the second circuit running at the third clock signal;
   generating a control signal, a cycle of the control signal corresponding to the safe cycle; and
   transferring the data from the first circuit running at the second clock signal to the second circuit running at the third clock signal according to the control signal.

17. The device of claim 11, wherein the translator is operable to transfer the data between the first circuit running at the second clock signal and the second circuit at the third clock signal in accordance with the safe cycle by:
   determining a plurality of safe cycles of the third clock signal corresponding to a second cycle of the plurality of second cycles of the second clock signal, each safe cycle of the plurality of safe cycles representing a cycle during which the data is to be transferred, the data comprising a request; and
   transferring the data during a last safe cycle of the safe cycles.

18. The device of claim 11, wherein the translator is operable to transfer the data between the first circuit running at the second clock signal and the second circuit at the third clock signal in accordance with the safe cycle by:
   determining a plurality of safe cycles of the third clock signal corresponding to a second cycle of the plurality of second cycles of the second clock signal, each safe cycle of the plurality of safe cycles representing a cycle during which the data is to be transferred, the data comprising a response; and
   transferring the data during a first safe cycle of the safe cycles.

19. The device of claim 11, further comprising a checker coupled to the clock control and operable to:
   predict a predicted occurrence of an alpha cycle;
   detect an actual occurrence of the alpha cycle;
   determine that the actual occurrence and the predicted occurrence are asynchronous; and
   determine that the first clock circuit and the second clock circuit are asynchronous.

20. The device of claim 11, further comprising a checker coupled to the clock control and operable to:
   predict a predicted occurrence of an alpha cycle;
   broadcast the predicted occurrence; and
   delay the predicted occurrence to synchronize the first clock circuit and the second clock circuit.

21. A system for providing a plurality of clock signals, comprising:
   means for receiving a first clock signal at a first clock circuit and at a second clock circuit, the first clock signal comprising a plurality of first cycles;
   means for generating a second clock signal from the first clock signal at the first clock circuit, the second clock signal comprising a plurality of second cycles, a second cycle of the plurality of second cycles corresponding to a first multiple of the first cycles;
   means for generating a third clock signal from the first clock signal at the second clock circuit, the third clock signal comprising a plurality of third cycles, a third cycle of the plurality of third cycles corresponding to a second multiple of the second cycles;
   means for sampling the first clock signal and the second clock signal using the third clock signal;
   means for determining a safe cycle in response to the sampled first clock signal and the sampled second clock signal; and
   means for transferring data between a first circuit running at the second clock signal and a second circuit running at the third clock signal in accordance with the safe cycle in order to provide the plurality of clock signals.

22. A method for providing a plurality of clock signals, comprising:
   receiving a first clock signal at a first clock circuit and at a second clock circuit, the first clock signal comprising a plurality of first cycles;
   generating a second clock signal from the first clock signal at the first clock circuit, the second clock signal comprising a plurality of second cycles, a second cycle of the plurality of second cycles corresponding to a first multiple of the first cycles;
   generating a third clock signal from the first clock signal at the second clock circuit, the third clock signal comprising a plurality of third cycles, a third cycle of the plurality of third cycles corresponding to a second multiple of the second cycles, the second multiple varying within a specified range;

sampling the first clock signal and the second clock signal using the third clock signal by detecting an edge of a third cycle of the plurality of third cycles of the third clock signal, sampling the second clock signal approximately when the edge is detected, and sampling the first clock signal approximately when the edge is detected;

detecting an alpha cycle of the third clock signal in response to the sampled first clock signal and the sampled second clock signal; and transferring data between a first circuit running at the second clock signal and a second circuit running at the third clock signal in accordance with the safe cycle in order to provide the plurality of clock signals by:

determining an occurrence of a first safe cycle in accordance with the alpha cycle, the first safe cycle representing a cycle during which the data is to be transferred from the second circuit running at the third clock signal to the first circuit running at the second clock signal, delaying the data from the second circuit running at the third clock signal, and transferring the data during the occurrence of the first safe cycle;

determining an occurrence of a second safe cycle in accordance with the alpha cycle, the second safe cycle representing a cycle during which the data is to be transferred from the first circuit running at the second clock signal to the second circuit running at the third clock signal, generating a control signal, a cycle of the control signal corresponding to the second safe cycle, and transferring the data from the first circuit running at the second clock signal to the second circuit running at the third clock signal according to the control signal;

determining a plurality of third safe cycles of the third clock signal corresponding to a second cycle of the second clock signal, a third safe cycle of the plurality of third safe cycles representing a cycle during which the data is to be transferred, the data comprising a request, and transferring the data during a last third safe cycle of the third safe cycles; and determining a plurality of fourth safe cycles of the third clock signal corresponding to a second cycle of the second clock signal, each fourth safe cycle of the plurality of fourth safe cycles representing a cycle during which the data is to be transferred, the data comprising a response, and transferring the data during a first fourth safe cycle of the safe cycles; and predicting a predicted occurrence of the alpha cycle, detecting an actual occurrence of the alpha cycle, determining that the actual occurrence and the predicted occurrence are asynchronous, and determining that the first clock circuit and the second clock circuit are asynchronous.

* * * * *